United States Patent
Bowlerwell et al.

(10) Patent No.: US 11,500,404 B2
(45) Date of Patent: Nov. 15, 2022

(54) BIASING CIRCUITRY

(71) Applicant: Cirrus Logic International Semiconductor Ltd., Edinburgh (GB)

(72) Inventors: John B. Bowlerwell, Edinburgh (GB); Andrew J. Howlett, Edinburgh (GB); Graeme S. Angus, Edinburgh (GB); Andrei Dumitriu, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 62 days.

(21) Appl. No.: 17/140,754

(22) Filed: Jan. 4, 2021

(65) Prior Publication Data

US 2021/0232165 A1 Jul. 29, 2021

Related U.S. Application Data

(60) Provisional application No. 62/964,738, filed on Jan. 23, 2020.

(30) Foreign Application Priority Data

Feb. 13, 2020 (GB) ...................................... 2001973

(51) Int. Cl.
  *G05F 1/563* (2006.01)
  *G05F 1/575* (2006.01)
  *G05F 1/62* (2006.01)
  *H03K 17/00* (2006.01)
  *H04R 3/00* (2006.01)

(52) U.S. Cl.
  CPC .............. *G05F 1/563* (2013.01); *G05F 1/575* (2013.01); *G05F 1/62* (2013.01); *H03K 17/002* (2013.01); *H04R 3/00* (2013.01)

(58) Field of Classification Search
  None
  See application file for complete search history.

(56) References Cited

U.S. PATENT DOCUMENTS

| 7,629,784 | B2 * | 12/2009 | Muller .................. | H02M 3/158 |
| | | | | 323/283 |
| 8,160,520 | B2 * | 4/2012 | Srinivasan ........... | H03G 1/0088 |
| | | | | 455/127.5 |
| 8,362,649 | B2 * | 1/2013 | Fisher ...................... | H02J 1/04 |
| | | | | 330/297 |
| 2011/0309679 | A1 | 12/2011 | Fisher et al. | |
| 2018/0158918 | A1 | 6/2018 | Lee et al. | |

FOREIGN PATENT DOCUMENTS

| CN | 106533187 A | 3/2017 |
| GB | 2371376 A | 7/2002 |

OTHER PUBLICATIONS

Combined Search and Examination Report under Sections 17 and 18(3), UKIPO, Application No. GB2001 973.3, dated Aug. 13, 2020.

\* cited by examiner

*Primary Examiner* — Jeffery S Zweizig
(74) *Attorney, Agent, or Firm* — Jackson Walker L.L.P.

(57) ABSTRACT

The present disclosure relates to circuitry for selecting a bias voltage to output at a bias voltage output node of the circuitry. The circuitry comprises a first circuit node configured to receive a first voltage from a first, unregulated, voltage source and a second circuit node configured to receive a second voltage from a second, regulated, voltage source. A switch arrangement configured to selectively couple the bias voltage output node to the first circuit node or the second circuit node is also provided.

16 Claims, 6 Drawing Sheets

BIASING CIRCUITRY

FIELD OF THE INVENTION

The present disclosure relates to the field of biasing circuitry, and in particular to biasing circuitry for providing a bias voltage at an output node for use, for example, to bias a transducer such as a microphone.

BACKGROUND

Many electronic devices include transducers such as microphones, force sensors and the like that require a bias voltage in order to operate correctly. The bias voltage is typically generated in circuitry (e.g. one or more integrated circuits) of the device, with the circuitry providing one or more bias voltage output nodes to which a transducer can be coupled so as to receive an appropriate bias voltage.

The performance of many transducers is related to the quality, accuracy, stability or other properties of the bias voltage supplied to the transducer. For example, the sensitivity of a microphone may depend, in part, on the power supply rejection ratio (PSRR) of a voltage regulator that is used to supply a bias voltage to the microphone.

In some circumstances it may be desirable to be able to switch between a high quality bias voltage whose generation entails relatively high power consumption (e.g. a bias voltage provided by a low drop-out regulator that receives a supply voltage from a charge pump), and a lower-quality bias voltage whose generation entails relatively lower power consumption (e.g. a bias voltage that is provided directly from an available power supply of a host electronic device).

For example, a device such as a mobile telephone, tablet computer, smart speaker, headphones, earphones, earbuds or the like may be able to respond to spoken commands from a user. The device may be operable in an always-on "listening" mode, in which one or more microphones and associated signal processing components are powered on in order to detect a spoken command, trigger or wake word or phrase uttered by a user, or some other trigger or wake sound (e.g. a handclap, whistle or the like) generated by the user. On detection of the trigger or wake word, phrase or sound, the device enters an "active" mode of operation in which it is able to receive and respond to spoken commands from the user.

As will be appreciated, operating the device in this manner may give rise to undesirably high power consumption, since the microphone(s) and signal processing components continue to receive power even when no trigger or wake sound is present.

One approach to reducing the power consumption of a device operating in an always-on "listening" mode is to bias the microphone(s) using a relatively lower quality power supply when the device is in the "listening" mode and to switch to a relatively higher quality power supply when a trigger or wake word, phrase or sound has been detected and the device must enter an "active" mode of operation. The sensitivity of the microphone(s) in the "listening" mode in this approach is reduced as compared to their sensitivity in the "active" mode, but is sufficient to enable detection of the trigger or wake word, phrase or sound. In this way the power consumption of the device when operating in the "listening" mode can be reduced, as components required in order to supply a high quality bias voltage for the microphone(s) can be switched off, disabled or powered down in the "listening" mode, and switched on, enabled or powered up only when the device enters the "active" mode.

SUMMARY

According to a first aspect, the invention provides circuitry for selecting a bias voltage to output at a bias voltage output node of the circuitry, the circuitry comprising:
  a first circuit node configured to receive a first voltage from a first, unregulated, voltage source;
  a second circuit node configured to receive a second voltage from a second, regulated, voltage source; and
  a switch arrangement configured to selectively couple the bias voltage output node to the first circuit node or the second circuit node.

The circuitry may comprise regulator circuitry for generating the second voltage, for example.

The regulator circuitry may comprise:
  first regulator circuitry configured to be coupled to a battery of a host device containing the circuitry; and
  second regulator circuitry coupled to an output of the first regulator circuitry, wherein the second regulator circuitry is configured to receive a first regulated voltage output by the first regulator circuitry and to generate the second voltage.

The circuitry may further comprise control circuitry, and the control circuitry may be configured to control operation of the switch arrangement.

The control circuitry may be further configured to selectively enable or disable the regulator circuitry.

For example, the control circuitry may be configured to control the operation of the switch arrangement and to selectively enable or disable the regulator circuitry based on a mode control signal received by the controller circuitry.

The mode control signal may be based on an output of a transducer that is coupled to the bias voltage output node, for example.

The circuitry may comprise a plurality of output bias voltage nodes and the switch arrangement may comprise a switch network configured to selectively couple each of the plurality of output bias voltage nodes to one of the first or second nodes.

The switch arrangement may comprise a plurality of PMOS switch devices, for example.

The circuitry may further comprise voltage selection circuitry configured to determine which one of the first voltage and the second voltage has the greater magnitude, and to apply the one of the first and second voltages that is determined to have the greater magnitude to bulk terminals of the PMOS switch devices.

The voltage selection circuitry may be further configured to provide the one of the first and second voltages that is determined to have the greater magnitude for use as a gate drive voltage for the PMOS switch devices.

The voltage selection circuitry may comprise:
  comparator circuitry configured to receive the first and second voltages and to output a control signal indicative of which of the first and second voltages has the greater magnitude; and
  multiplexer circuitry configured to receive the first and second voltages and the control signal output by the comparator circuitry and to output the one of the first and second voltages that has the greater magnitude based on the control signal.

According to a second aspect, the invention provides circuitry for providing a bias voltage to a plurality of bias voltage output nodes, the circuitry comprising:

a first node configured to receive a first regulated voltage from a first regulated voltage source;

a second node configured to receive a second unregulated voltage from a second unregulated voltage source; and a switch network operative to selectively couple each of the plurality of bias voltage output nodes to one of the first or second nodes.

According to a third aspect, the invention provides circuitry for selecting a bias voltage to output at a bias voltage output node, the circuitry comprising:

a first regulated voltage source;

a first node coupled to the first regulated voltage source so as to receive a first regulated voltage therefrom;

a second node configured to receive a second unregulated voltage from a second unregulated voltage source; and controller circuitry configured to:

selectively enable or disable the first regulated voltage source; and selectively couple the bias voltage output node to the first or second node in response to a mode control signal received by the controller circuitry.

The controller circuitry may be configured to:

enable the first regulated voltage source; and couple the bias voltage output node to the first node in response to a mode control signal received by the controller circuitry indicative of detection of a user activation command.

The controller circuitry may be configured to:

disable the first regulated voltage source; and couple the bias voltage output node to the second node in response to a mode control signal received by the controller circuitry indicative that no user command has been detected for a predetermined period of time.

The mode control signal may be based on an output of a transducer that is coupled to the bias voltage output node, for example.

According to a further aspect, the invention provides integrated circuitry comprising the circuitry of any one of the first, second or third aspects described above.

According to a further aspect, the invention provides device comprising the circuitry of any one of the first, second or third aspects described above.

The device may comprise a mobile telephone, a tablet or laptop computer, a smart speaker, an accessory device, headphones, earphones or earbuds, for example.

BRIEF DESCRIPTION OF THE DRAWINGS

Embodiments of the invention will now be described, strictly by way of example only, with reference to the accompanying drawings, of which.

DETAILED DESCRIPTION

Figure 1:
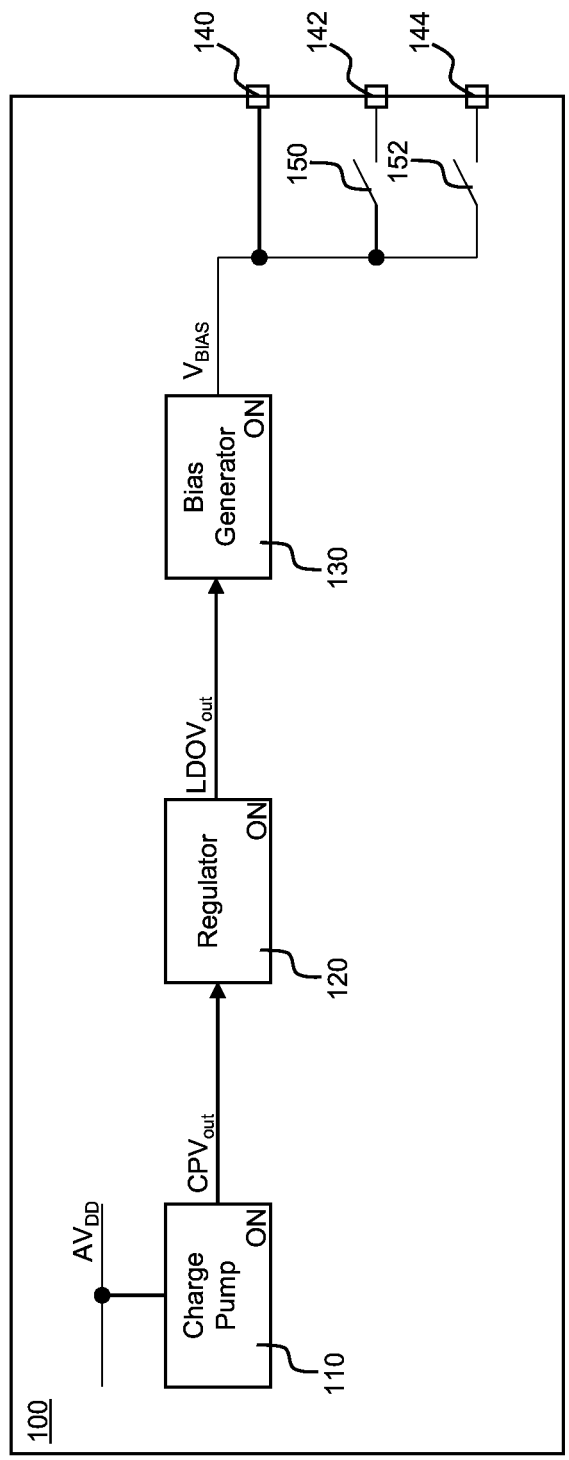
FIG. 1 is a schematic diagram showing circuitry for providing a bias voltage at a plurality of bias voltage output nodes.

Referring first to FIG. 1, biasing circuitry for providing a bias voltage at a plurality of bias voltage output nodes is shown generally at 100. The biasing circuitry 100 may be implemented in as one or more integrated circuits, for example.

The biasing circuitry 100 includes a charge pump 110, which is configured to receive an unregulated supply voltage $AV_{DD}$. The unregulated supply voltage $AV_{DD}$ may be, for example, a supply voltage for supplying analogue components and/or subsystems of a host electronic device such as a mobile telephone, laptop or tablet computer, smart speaker, headphones, earphone, earbuds or the like. The supply voltage $AV_{DD}$ may have a nominal value of 1.8 volts, for example.

The charge pump 110 is configured to generate a boosted output voltage $CPV_{out}$, in a manner that will be familiar to those of ordinary skill in the art. The boosted output voltage $CPV_{out}$ may be, for example, double the unregulated supply voltage $AV_{DD}$. Thus, where the unregulated supply voltage $AV_{DD}$ is 1.8 volts, the boosted output voltage $CPV_{out}$ may be 3.6 volts, for example. The boosted output voltage $CPV_{out}$ provides the voltage headroom required for operation of downstream components of the biasing circuitry 100.

An output of the charge pump 110 is coupled to an input of a voltage regulator 120, which may be for example, a low drop-out (LDO) regulator. The voltage regulator 120 is configured to receive the boosted output voltage $CPV_{out}$ output by the charge pump 110 and to generate, from the boosted output voltage $CPV_{out}$, a regulated output voltage $LDOV_{out}$, again in a manner that will be familiar to those of ordinary skill in the art. The voltage regulator 120 may be configured to have a high power supply rejection ratio (PSRR) and thus to produce a stable, high accuracy regulated output voltage $LDOV_{out}$. The regulated output voltage $LDOV_{out}$ may have a value of 3.1 volts, for example.

An output of the voltage regulator 120 is coupled to an input of a bias voltage generator 130. The bias voltage generator 130 may be, for example, a voltage regulator such as an LDO. The bias voltage generator 130 is configured to receive the regulated output voltage $LDOV_{out}$ and to generate, from the regulated output voltage $LDOV_{out}$, a bias voltage $V_{BIAS}$, again in a manner that will be familiar to those of ordinary skill in the art. The bias voltage generator 130 may also be configured to have a high power supply rejection ratio (PSRR) and thus to produce a stable, high accuracy regulated bias voltage $V_{BIAS}$ at its output. The bias voltage $V_{BIAS}$ may be variable, for example in the range 1.5 volts-3 volts.

A first bias voltage output node 140 is coupled to an output of the bias generator 130 so as to receive the bias voltage $V_{BIAS}$ from the bias voltage generator 130. Second and third bias voltage output nodes 142, 144 may also be provided. The second bias voltage output node 142 (if provided) may be coupled to the output of the bias voltage generator 130 via a first switch 150, to allow the second bias voltage output node 142 to be selectively coupled to the output of the bias voltage generator 130. Similarly, the third bias voltage output node 144 (if provided) may be coupled to the output of the bias voltage generator 130 via a second switch 152, to allow the third bias voltage output node 144 to be selectively coupled to the output of the bias voltage generator 130.

In a first or high power mode of operation of the biasing circuitry 100, the charge pump 110, regulator 120 and bias voltage generator 130 are all powered up or switched on. In this operating mode the charge pump 110 operates to generate the boosted output voltage $CPV_{out}$, the voltage regulator 120 operates to generate the regulated voltage $LDOV_{out}$, and the bias voltage generator 130 operates to generate the regulated bias voltage $V_{BIAS}$. Thus, in the first or high power mode of operation any transducers coupled to the first bias voltage output node 140 and (if provided) the second and third bias voltage output nodes 142, 144, will receive a stable bias voltage, which may allow any such transducer to operate with high sensitivity, for example.

In some applications (e.g. an always-on listening mode of a host device such as a mobile telephone, tablet or laptop computer, smart speaker, headphone, earphone, earbud or the like) operating the biasing circuitry 100 in the first or high power mode can lead to relatively significant power consumption in the host device. Thus in such applications it is desirable to be able to switch to a lower power mode of operation in which the connected transducer(s) remain operational, albeit with lower sensitivity, while reducing the power consumption of the circuitry in comparison to the full-power mode of operation.

Figure 2:
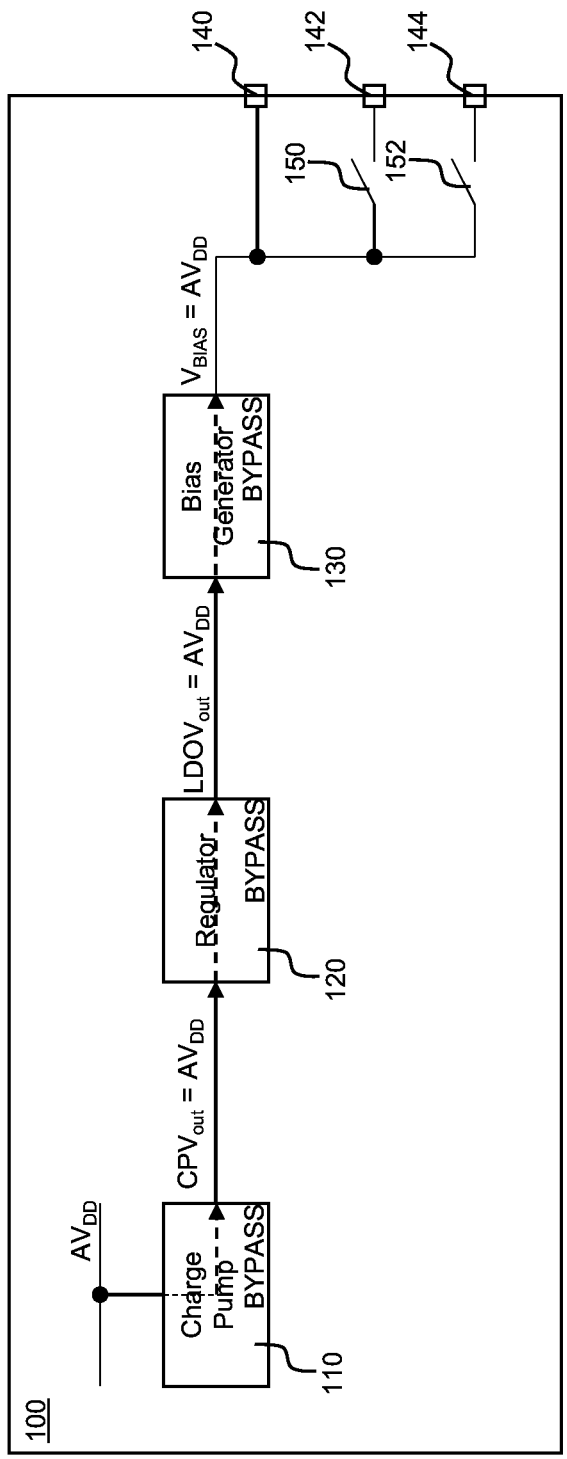
FIG. 2 is a schematic diagram showing the circuitry of FIG. 1 in a bypass mode of operation.

FIG. 2 illustrates the biasing circuitry 100 of FIG. 1 in a second or bypass mode of operation. Like elements in FIGS. 1 and 2 are denoted by like reference numerals.

In the bypass mode of operation the charge pump 110 is bypassed by coupling its supply ($AV_{DD}$) directly to its output (as shown by the dashed arrow in FIG. 2), such that the output $CPV_{out}$ of the charge pump 110 is equal to the supply voltage $AV_{DD}$.

Similarly, the input of the voltage regulator 120 is coupled directly to its output (as indicated by the dashed arrow) so as to bypass the voltage regulator 120, such that the output $LDOV_{out}$ of the voltage regulator 120 is equal to the supply voltage $AV_{DD}$.

Likewise, the input of the bias voltage generator 130 is coupled directly to its output (as indicated by the dashed arrow) so as to bypass the bias voltage generator 130, such that the output $V_{BIAS}$ of the bias voltage generator 130 is equal to the supply voltage $AV_{DD}$.

Thus, in the bypass mode of operation any transducers coupled to the first bias voltage output node 140 and (if provided) the second and third bias voltage output nodes 142, 144, will receive a lower accuracy unregulated bias voltage having a magnitude of $AV_{DD}$. This bias voltage allows any such transducer to operate with lower sensitivity than in the normal operating mode of the biasing circuitry 100, whilst reducing the power consumption of the biasing circuitry 100, as the charge pump 110, voltage regulator 120 and bias voltage generator 130 can be switched off, disabled or powered down.

Whilst the arrangement described above with reference to FIG. 2 does provide a reduction in the power consumption of the biasing circuitry 100 when operating in the bypass mode, the charge pump 110, voltage regulator 120 and bias voltage generator 130 must still be provided in order to enable the biasing circuitry 100 to operate in the first (high power) operating mode. As will be appreciated by those of ordinary skill in the art, the individual elements of the biasing circuitry 100 (i.e. the charge pump 110, voltage regulator 120 and bias voltage generator 130) are typically relatively large and therefore occupy a relatively large area of integrated circuitry. Further, the charge pump 110 in particular requires several connection balls or pins.

Thus, it would be advantageous to provide alternative circuitry for providing a bias voltage to one or more bias voltage output nodes in which the circuitry can be switched between a first, relatively high power, mode of operation and a second, relatively low power, mode of operation, whilst reducing the size and/or pin/ball count of such circuitry in comparison with the circuitry illustrated in FIGS. 1 and 2.

Figure 3:
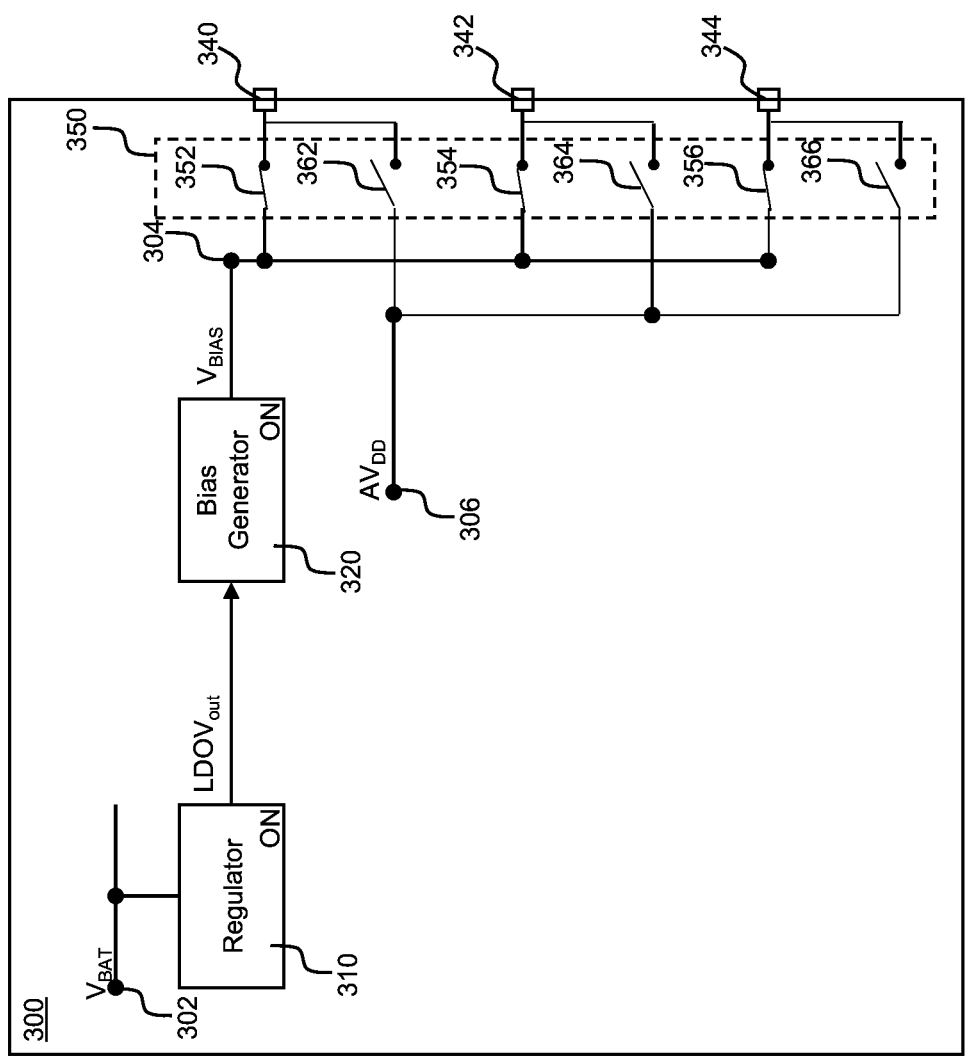
FIG. 3 is a schematic diagram showing alternative circuitry for providing a bias voltage at a plurality of bias voltage output nodes.

Referring now to FIG. 3, alternative circuitry for providing a bias voltage at a plurality of bias voltage output nodes is shown generally at 300. The biasing circuitry 300 may be implemented in integrated circuitry, for example.

The biasing circuitry 300 includes a voltage regulator 310 which may be, for example, an LDO. The voltage regulator 310 receives at an input thereof an unregulated supply voltage $V_{BAT}$ from a first circuit node 302 that is coupled to a battery of a host device (e.g. a mobile telephone, tablet or laptop computer, smart speaker, headphone, earphone, earbud or the like) that incorporates the circuitry. The supply voltage $V_{BAT}$ may be of the order of 5 volts, for example. Because the supply voltage $V_{BAT}$ in the biasing circuitry 300 is higher than the supply voltage $AV_{DD}$ in the circuitry of FIG. 1 (e.g. 5 volts rather than 1.8 volts), no charge pump is required to boost the supply voltage in order to provide the required voltage headroom for downstream components of the biasing circuitry 300.

The voltage regulator 310 is configured to generate, from the unregulated supply voltage $V_{BAT}$, a regulated output voltage $LDOV_{out}$, in a manner that will be familiar to those of ordinary skill in the art. The voltage regulator 310 may be configured to have a high power supply rejection ratio (PSRR) and thus to produce a stable, high accuracy regulated output voltage $LDOV_{out}$. The regulated output voltage $LDOV_{out}$ may have a value of 3.1 volts, for example.

An output of the voltage regulator 310 is coupled to an input of a bias voltage generator 320. The bias voltage generator 320 may be, for example a voltage regulator such as an LDO. The bias voltage generator 320 is configured to receive the regulated output voltage $LDOV_{out}$ and to generate, from the regulated output voltage $LDOV_{out}$, a bias voltage $V_{BIAS}$, again in a manner that will be familiar to those of ordinary skill in the art.

The bias voltage generator 310 may also be configured to have a high power supply rejection ratio (PSRR) and thus to produce a stable, high accuracy regulated bias voltage $V_{BIAS}$ at its output. The bias voltage $V_{BIAS}$ may be variable, for example in the range 1.5 volts-3 volts.

A first bias voltage output node 340 is coupled to a second circuit node 304, which is in turn coupled to an output of the bias generator 320, via a first bias voltage selection switch 352 of a switch network 350 so as to selectively receive the bias voltage $V_{BIAS}$ from the bias voltage generator 320.

Second and third bias voltage output nodes 342, 344 may also be provided. The second bias voltage output node 342 (if provided) may be coupled to the second circuit node 304 (and hence to the output of the bias voltage generator 320) via a second bias voltage selection switch 354 of the switch network 350, to allow the second bias voltage output node 342 to be selectively coupled to the output of the bias voltage generator 320.

Similarly, the third bias voltage output node 344 (if provided) may be coupled to the second circuit node 304 (and hence to the output of the bias voltage generator 320) via a third bias voltage selection switch 356 of the switch network 350, to allow the third bias voltage output node 144 to be selectively coupled to the output of the bias voltage generator 130.

The biasing circuitry 300 also includes a third circuit node 306 which is coupled to an unregulated supply voltage $AV_{DD}$. The unregulated supply voltage $AV_{DD}$ may be, for example, a supply voltage for supplying analogue components and/or subsystems of the host device.

The switch network 350 includes a first unregulated supply voltage selection switch 362 coupled between the third circuit node 306 and the first bias voltage output node 340.

The first unregulated supply voltage selection switch 362 is operative to selectively couple the first bias voltage output node 340 to the unregulated supply voltage $AV_{DD}$. By selectively actuating the first bias voltage selection switch 352 and the first unregulated supply voltage selection switch 362, the first bias voltage output node 340 can be coupled to the second circuit node 304, so as to receive the regulated bias voltage $V_{BIAS}$, or to the third circuit node 306, so as to receive the unregulated supply voltage $AV_{DD}$. Specifically, by closing the first bias voltage selection switch 352 and opening the first unregulated supply voltage selection switch 362, the first bias voltage output node 340 can be coupled to the bias voltage generator 320 (via the second circuit node 304) so as to receive the regulated bias voltage $V_{BIAS}$. Alternatively, by opening the first bias voltage selection switch 352 and closing the first unregulated supply voltage selection switch 362, the first bias voltage output node 340 can be coupled to the third circuit node 306 so as to receive the unregulated supply voltage $AV_{DD}$.

Where the second and third bias voltage output nodes 342, 344 are provided, the switch network 350 also includes second and third unregulated supply voltage selection switches 364, 366 coupled, respectively, between the third circuit node 306 and the second bias voltage output node 342 and between the third circuit node 306 and the third bias voltage output node 344.

The second and third unregulated supply voltage selection switches 364, 366 are operative, respectively, to selectively couple the second and third bias voltage output nodes 342, 344 to the unregulated supply voltage $AV_{DD}$. By selectively actuating the second bias voltage selection switch 354 and the second unregulated supply voltage selection switch 364, the second bias voltage output node 342 can be coupled to either the second circuit node 304 so as to receive the regulated bias voltage $V_{BIAS}$, or to the third circuit node 306, so as to receive the unregulated supply voltage $AV_{DD}$. Specifically, by closing the second bias voltage selection switch 354 and opening the second unregulated supply voltage selection switch 364, the second bias voltage output node 342 can be coupled to second circuit node 304 (and hence to the output of the bias voltage generator 320) so as to receive the regulated bias voltage $V_{BIAS}$. Alternatively, by opening the second bias voltage selection switch 354 and closing the second unregulated supply voltage selection switch 364, the second bias voltage output node 342 can be coupled to the third circuit node 306 so as to receive the unregulated supply voltage $AV_{DD}$. The third bias voltage selection switch 356 and the third unregulated supply voltage selection switch 366 can be actuated in the same way to couple the third bias voltage output node 344 to either the bias voltage generator 320 (via the second circuit node 304) or to the unregulated supply voltage $AV_{DD}$.

In a first (or high power) mode of operation of the biasing circuitry 300, as shown in FIG. 3, the voltage regulator 310 and the bias voltage generator 320 are both powered up, enabled or switched on. In this operating mode the voltage regulator 310 operates to generate the regulated voltage $LDOV_{out}$, and the bias voltage generator 320 operates to generate the regulated bias voltage $V_{BIAS}$. The first, second and third bias voltage selection switches 352, 354, 356 of the switch network 350 are closed, thereby coupling the first, second and third bias voltage output nodes 340, 342, 344 to the second circuit node 304 and hence to the output of the bias voltage generator 320, and the first, second and third unregulated supply voltage selection switches 362, 364, 366 are opened, thereby decoupling the first, second and third bias voltage output nodes 340, 342, 344 from the third circuit node 306.

Thus, in the first or high power mode of operation any transducer coupled to the first bias voltage output node 340 or (if provided) the second or third bias voltage output nodes 342, 344, will receive the accurate and stable bias voltage $V_{BIAS}$ output by the bias voltage generator 320, which may allow any such transducer to operate with high sensitivity, for example.

The absence of a charge pump 110 from the biasing circuitry 300 may reduce the power consumption of the biasing circuitry 300, in comparison to that of the biasing circuitry 100 of FIG. 1. However, in some circumstances (e.g. in the always-on listening mode discussed above) it may be desirable to reduce the power consumption of the biasing circuitry 300 further.

Figure 4:
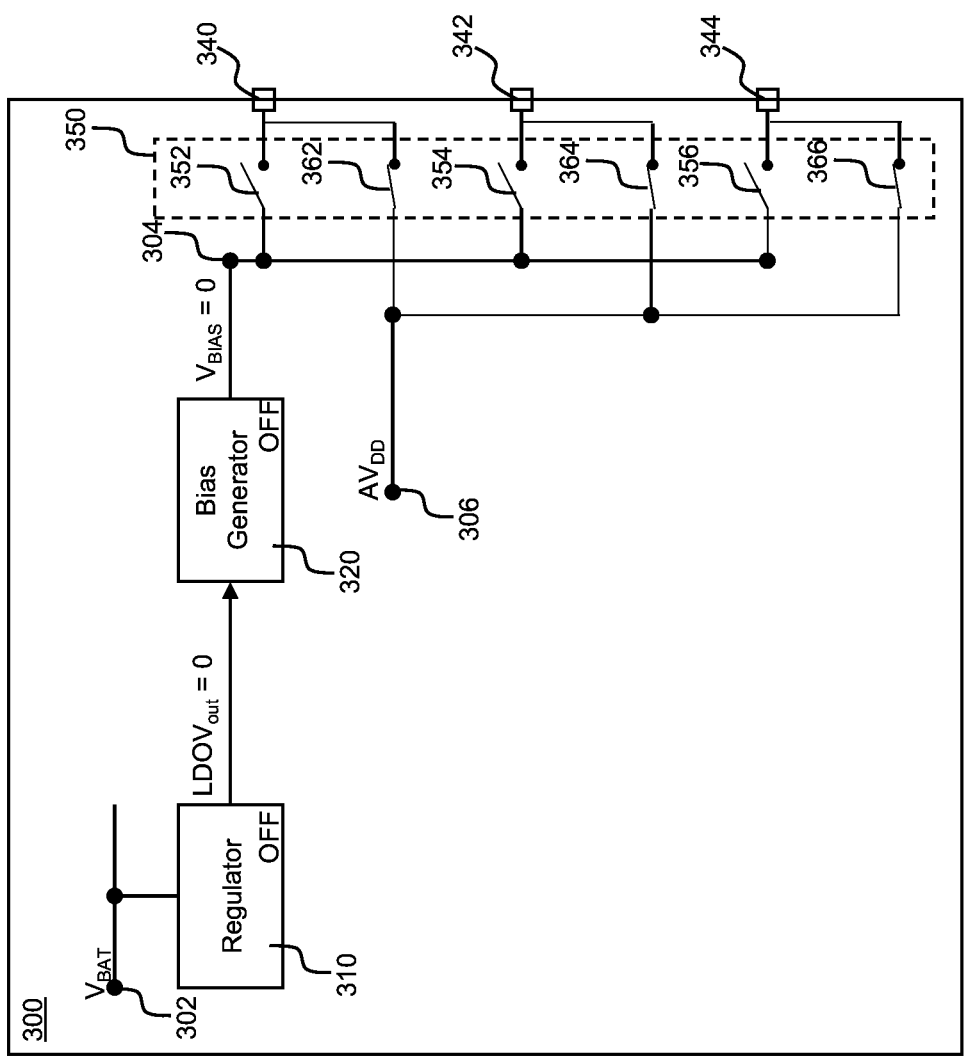
FIG. 4 is a schematic diagram showing the circuitry of FIG. 3 in a second mode of operation.

FIG. 4 illustrates the biasing circuitry 300 of FIG. 3 in a second, low power mode of operation. Like elements in FIGS. 3 and 4 are denoted by like reference numerals.

In the second, low power operating mode, the voltage regulator 310 and the bias generator 320 of the biasing circuitry 300 are switched off, disabled or powered down, thereby reducing the power consumption of the circuitry in comparison to operation in the first or high power operating mode. Thus, neither the voltage regulator 310 nor the bias generator 320 outputs a regulated output voltage (i.e. $LDOV_{out}=0$ volts and $V_{BIAS}=0$ volts).

The first, second and third bias voltage selection switches 352, 354, 356 of the switch network 350 are opened, thereby decoupling the first, second and third bias voltage output nodes 340, 342, 344 from the second circuit node 304 and the output of the bias voltage generator 320, and the first, second and third unregulated supply voltage selection switches 362, 364, 366 are closed, thereby coupling the first, second and third bias voltage output nodes 340, 342, 344 to the third circuit node 306.

Thus, in the low power mode of operation any transducer coupled to the first bias voltage output node 340 or (if provided) the second or third bias voltage output nodes 342, 344, will receive the unregulated supply voltage $AV_{DD}$, which may allow any such transducer to continue to operate with reduced sensitivity (in comparison to its operation when the biasing circuitry 300 is in its normal or high power operating mode), whilst also permitting a reduction in the power consumption of the biasing circuitry 300 in comparison to operation of the biasing circuitry 300 in the first or high power operating mode.

In the examples described above with reference to FIGS. 3 and 4, the first, second and third bias voltage selection switches 352, 354, 356 are either all closed or all opened at the same time, and the first, second and third unregulated supply voltage selection switches 362, 364, 366 are either all open or all closed at the same time. Thus, in the examples described above all of the bias voltage output nodes 340, 342, 344 receive either the high quality regulated bias voltage $V_{BIAS}$ or the lower quality unregulated voltage $AV_{DD}$.

In some examples the first, second and third bias voltage selection switches 352, 354, 356 are operable independently of each other, and the first, second and third unregulated supply voltage selection switches 362, 364, 366 are also operable independently of each other. This arrangement permits each of the bias voltage output nodes to receive a different one of the voltages $V_{BIAS}$ and $AV_{DD}$.

For example, if the voltage regulator 310 and the bias generator 320 of the biasing circuitry 300 are switched on, enabled or powered up, then closing the first bias voltage selection switch 352 and opening the first unregulated supply voltage selection switch 362 will couple the first bias voltage output node 340 to the bias voltage generator 320 via the first circuit node 302 and thus the first bias voltage output node will receive the voltage $V_{BIAS}$. If the second and third bias voltage selector switches 354, 356 are opened and the second and third unregulated voltage supply selector switches 364, 366 are closed, the second and third bias voltage output nodes 342, 344 are coupled to the third circuit node 306 so as to receive the unregulated supply voltage $AV_{DD}$.

Thus, by operating the first, second and third bias voltage selection switches 352, 354, 356 independently of each other, and operating the first, second and third unregulated supply voltage selection switches 362, 364, 366 independently of each other, different combinations of regulated and unregulated voltages can be provided at the bias voltage output nodes 340, 342, 344.

Figure 5:
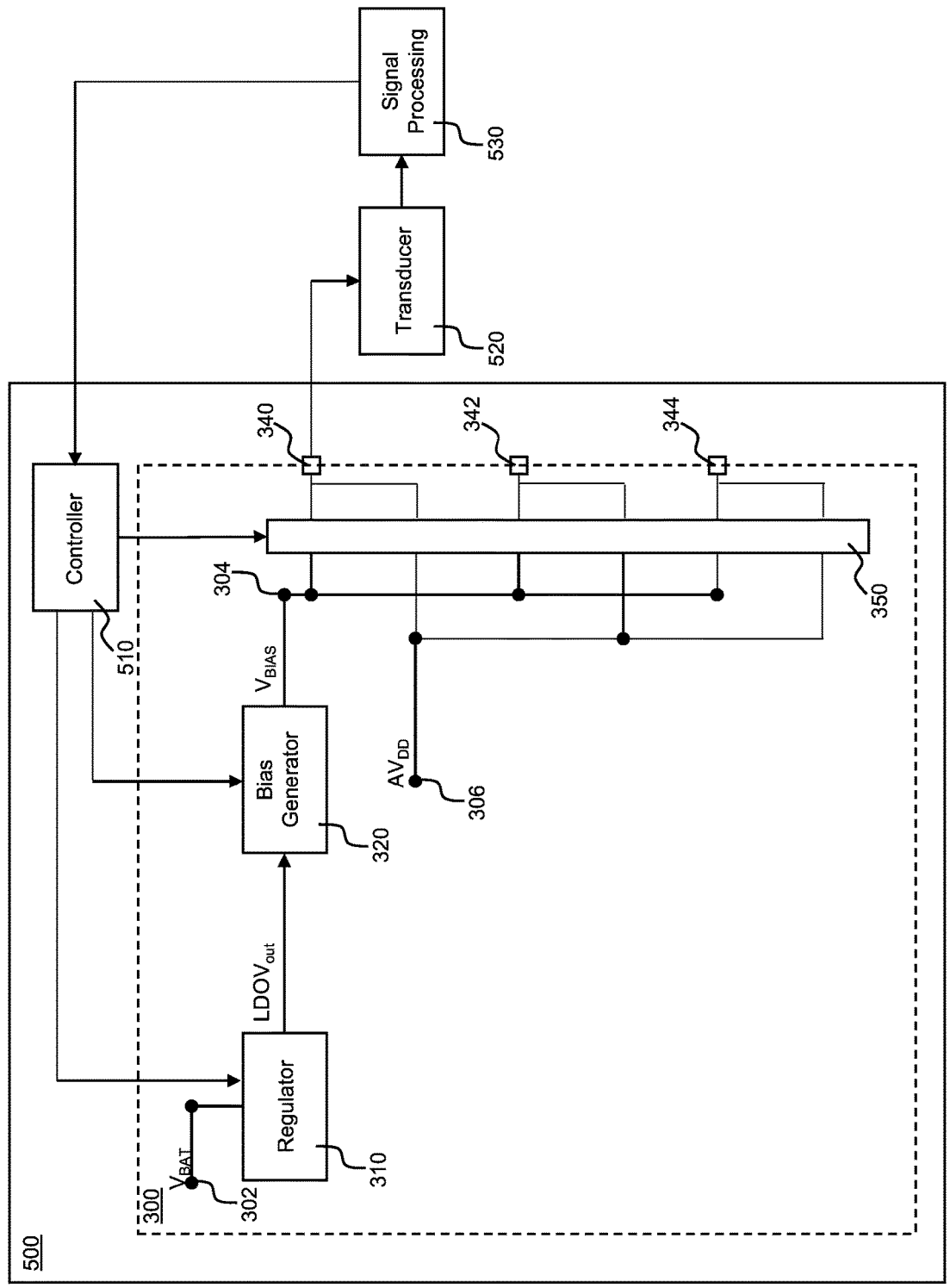
FIG. 5 is a schematic diagram illustrating control of a switch network to switch between bias voltage sources in the circuitry of FIGS. 3 and 4.

FIG. 5 is a schematic representation of circuitry 500 that includes the biasing circuitry 300 of FIGS. 3 and 4 and additional controller circuitry to switch the biasing circuitry 300 between its first (high power) and second (low power) modes of operation. Like elements in FIGS. 3, 4 and 5 are denoted by like reference numerals.

In the circuitry 500 controller circuitry 510 is provided to control the operation of the voltage regulator 310, the bias voltage generator 320 and the switches of the switch network 350 to switch the biasing circuitry 300 between its first (high power) operating state, as described above with reference to FIG. 3, and its second (low power) operating state, as described above with reference to FIG. 4. Thus, the controller circuitry 510 has outputs that are coupled to the voltage regulator 310, the bias generator 320 and the switch network 350.

To switch from the first operating state to the second operating state, the controller circuitry 510 is operative to output control signals to the voltage regulator 310 and the bias generator 320 to switch off, disable or power down the voltage regulator 310 and the bias generator 320, to output control signals to the switch network 350 to close the first, second and third bias voltage selection switches 352, 354, 356 and to open the first, second and third unregulated supply voltage selection switches 362, 364, 366.

To switch from the second operating state to the first operating state, the controller circuitry 510 is operative to output control signals to the voltage regulator 310 and the bias generator 320 to switch on, enable or power up the voltage regulator 310 and the bias generator 320, and to output control signals to the switch network 350 to open the first, second and third bias voltage selection switches 352, 354, 356 and to close the first, second and third unregulated supply voltage selection switches 362, 364, 366.

The controller circuitry 510 may also be operable to output control signals to each of the first, second and third bias voltage selection switches 352, 354, 356 to cause those switches to open or close independently of each other, and to output control signals to each of the first, second and third unregulated supply voltage selection switches 362, 364, 366 to cause those switches to open or close independently of each other, in order to provide different combinations of regulated and unregulated voltages can be provided at the bias voltage output nodes 340, 342, 344 as described above.

The biasing circuitry 300 may be switched between its first (high power) and second (low power) modes of operation based on the output of a transducer that is coupled to one of the bias voltage output nodes 340, 342, 344.

For example, a transducer 520, which may be, for example, a microphone, may be coupled to the first bias voltage output node 340 so as to receive a bias voltage. An output of the transducer 520 may be coupled to an input of signal processing circuitry 530 which may be, for example, analogue to digital converter (ADC) circuitry (and associated amplifier or buffer circuitry where necessary), a digital signal processor or some other signal processing unit, component or circuitry. An output of the signal processing circuitry 530 is coupled to an input of the controller circuitry 510.

The controller circuitry 510 may be operative to maintain the biasing circuitry 300 in its second, low power, operating mode until a mode control signal (e.g. a signal indicative of detection of a trigger or wake-up word, phrase, sound or other signal) is output by the signal processing circuitry 530.

For example, where the circuitry 500 forms part of a host device such as a mobile telephone, tablet or laptop computer, smart speaker, headphone, earphone, earbud or the like, the transducer 520 may be a microphone that also forms part of the host device, and the controller circuitry 510 may be operative to maintain the biasing circuitry 300 in its low power operating mode until a mode control signal indicative of detection of a trigger or wake-up word, phrase or other sound (e.g. a handclap) is output by the signal processing circuitry 530 to the controller circuitry 510.

When the controller circuitry 510 receives from the signal processing circuitry 530 a mode control signal indicative of detection of the trigger or wake-up word, phrase or other sound, the controller circuitry 510 outputs appropriate control signals to the voltage regulator 310, bias generator 320 and switch network 350 as described above to switch on, enable or power up the voltage regulator 310 and the bias generator 320, to open the first, second and third bias voltage selection switches 352, 354, 356 and to close the first, second and third unregulated supply voltage selection switches 362, 364, 366, thereby switching the biasing circuitry 300 into its first (high power) operating mode.

Controlling the operating mode in this way helps to minimise the power consumption of the biasing circuitry 300 when the host device is in a passive listening mode, whilst also facilitating a rapid transition to an active mode when the trigger or wake-up word, phrase or other sound is detected.

In the low power second mode of operation, the sensitivity of the transducer (e.g. microphone) 520, which is governed, at least in part, by the quality or accuracy of the bias voltage, is sufficient to detect the trigger word, phrase or sound, but does not require the relatively power-hungry high accuracy regulated power supply circuitry (i.e. voltage regulator 310 and bias generator 320) to be active. In the higher power first mode of operation the voltage regulator 310 and bias generator 320 are activated to provide a high quality, high accuracy regulated bias voltage to the transducer 520, to increase the sensitivity of the transducer 520, thereby helping the host device to distinguish spoken user commands from background noise, and to discriminate between different spoken user commands, for example.

The controller circuitry 510 may be operative to monitor the output of the signal processing circuitry 530 and to cause the biasing circuitry 300 to revert to its low power second mode of operation if a mode control signal output by the signal processing circuitry 530 is indicative that no user command or trigger word, phrase or sound has been detected for a predetermined period of time. In this way the power consumption of the biasing circuitry 300 can be reduced when high transducer sensitivity is not required.

Although the operation of the circuitry 500 has been described above using the example of a microphone as the transducer 520, it will be appreciated by those of ordinary skill in the art that the same principles apply to use of the circuitry with other types of transducer. For example, the transducer 520 could be a force sensor, and the controller circuitry 510 could be operative to switch the biasing circuitry 300 from its low power second state to its higher power first state on detection of a touch of a predetermined magnitude on the force sensor (as indicated by the signal output by the signal processing circuitry 530), and to cause the biasing circuitry 300 to revert to its low power first state if the output of the signal processing circuitry 530 is indicative that no touches have been detected on the force sensor for a predetermined period of time.

The switches of the switching network 350 may be implemented as PMOS switch devices. In order to ensure correct operation of the PMOS switch devices in the circuitry 300 the bulk terminal of the PMOS switch device should be correctly biased with an appropriate bias voltage. However, because of the arrangement of switches in the circuitry 300 described above, in which the source terminals of each switch device are coupled either to the second circuit node 304 or the third circuit node 306 and the drain terminals are connected to one of the bias voltage output nodes 340, 342, 344, it is possible that either side (i.e. either the source terminal or the drain terminal) of the PMOS switch device could be at a higher potential than the other side. In other words, because of the arrangement of the PMOS switch devices employed in the circuitry 300, the source terminal could be at a higher potential than the drain terminal, or the drain terminal could be at a higher potential than the source terminal. Thus for correct operation of the PMOS switch devices in the circuitry 300, their bulk terminals cannot simply be coupled to either their source terminal or their drain terminal, as might typically be the case.

Figure 6:
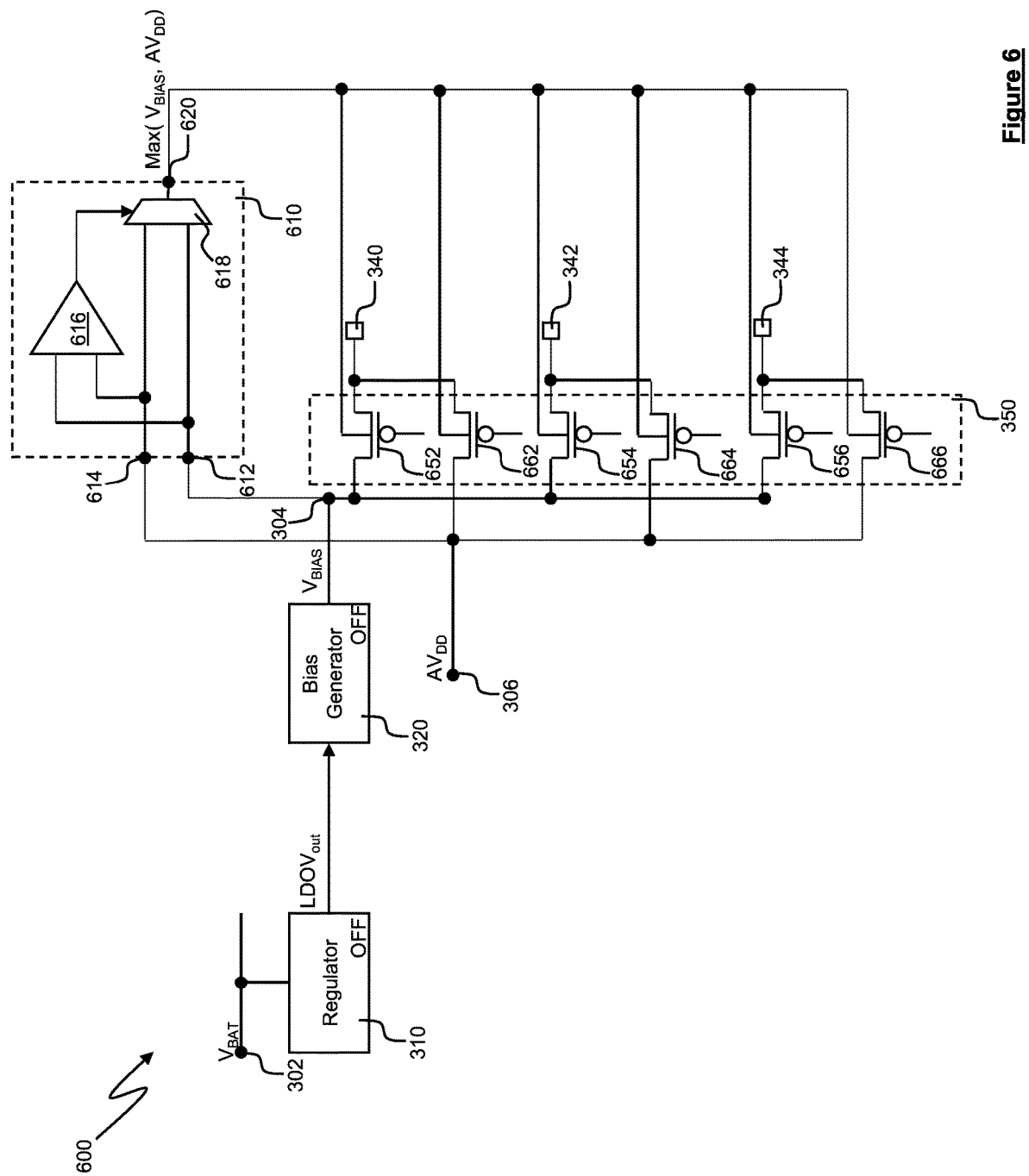
FIG. 6 is a schematic diagram illustrating selection and use of the highest available bias voltage in the circuitry of FIGS. 3 and 4.

FIG. 6 is a schematic representation of circuitry 600 including the biasing circuitry 300 of FIG. 3 and additional voltage selection circuitry 610 that can be used to select an appropriate voltage to apply to the bulk terminal of the PMOS switches that make up the switch network 350. Like elements in FIGS. 3, 4, 5 and 6 are denoted by like reference numerals.

As shown in FIG. 6, the switch network 350 (shown in dashed outline in FIG. 6) includes first, second and third PMOS bias voltage selection switch devices 652, 654, 656 (corresponding to the first, second and third bias voltage selection switches 352, 354, 356 shown in FIGS. 3 and 4) and first, second and third PMOS unregulated supply voltage selection switch devices 662, 664, 666 (corresponding to the first, second and third unregulated supply voltage selection switches 362, 364, 366 shown in FIGS. 3 and 4).

A gate terminal of each of these PMOS switch devices 652, 654, 656, 662, 664, 666 is configured to receive control signals (e.g. from the controller circuitry 510 of FIG. 5) to control the operation of the PMOS switch device.

A source terminal of each of the bias voltage selection switch devices 652, 654, 656 is coupled to the second circuit node 304, and thus to the output of the bias generator 320. A source terminal of each of the unregulated supply voltage selection switch devices 662, 664, 666 is coupled to the third circuit node 306 so as to receive the unregulated supply voltage $AV_{DD}$.

Drain terminals of the first PMOS bias voltage selection switch device 652 and the first PMOS unregulated supply voltage selection switch device 662 are coupled to the first bias voltage output node 340. Similarly, drain terminals of the second PMOS bias voltage selection switch device 654 and the second PMOS unregulated supply voltage selection switch device 664 are coupled to the second bias voltage output node 342, and drain terminals of the third PMOS bias voltage selection switch device 656 and the third PMOS unregulated supply voltage selection switch device 666 are coupled to the third bias voltage output node 344.

A bulk terminal of each of the PMOS switch devices 652, 654, 656, 662, 664, 666 is coupled to an output 620 of the voltage selection circuitry 610, so as to receive a suitable bulk bias voltage from the voltage selection circuitry 610.

In the example illustrated in FIG. 6, the voltage selection circuitry 610 has a first input 612 which is coupled to the second circuit node 304 so as to receive the regulated bias voltage $V_{BIAS}$ output by the bias voltage generator 320 and a second input 614 which is coupled to the third circuit node 306 so as to receive the unregulated supply voltage $AV_{DD}$. Within the voltage selection circuitry 610, the first and second inputs 612, 614 are coupled to first and second input terminals of comparator circuitry 616, whose output is coupled to a control input terminal of multiplexer circuitry 618. The first and second inputs 612, 614 are also coupled to respective first and second input terminals of the multiplexer circuitry 618.

The comparator circuitry 616 is operative to compare the magnitude of the regulated bias voltage $V_{BIAS}$ to that of the unregulated supply voltage $AV_{DD}$, and to output a control signal indicating which of the two voltages has the greater magnitude to the control input terminal of the multiplexer circuitry 618. For example, if the magnitude of the regulated bias voltage $V_{BIAS}$ is greater than that of the unregulated supply voltage $AV_{DD}$, a signal having a positive voltage may be output by the comparator circuitry 616 to the control input terminal of the multiplexer circuitry 618, while if the magnitude of the regulated bias voltage $V_{BIAS}$ is less than that of the unregulated supply voltage $AV_{DD}$, a 0V signal may be output by the comparator circuitry 616 to the control input terminal of the multiplexer circuitry 618.

The multiplexer circuitry 618 is operative to select and output either the regulated bias voltage $V_{BIAS}$ or the unregulated supply voltage $AV_{DD}$, based on the signal received at its control input terminal. Thus the multiplexer circuitry 618 outputs whichever one of the regulated bias voltage $V_{BIAS}$ and the unregulated supply voltage $AV_{DD}$ that has the highest magnitude. An output of the multiplexer circuitry 618 is coupled to the output 620 of the voltage section circuitry 610, such that the voltage selected by the multiplexer circuitry 618 is provided to the bulk terminals of the PMOS switch devices 652, 654, 656, 662, 664, 666 to bias the bulk terminals of the PMOS switch devices 652, 654, 656, 662, 664, 666 with the selected voltage. The voltage selected by the multiplexer circuitry 618 also used as a gate drive voltage, e.g. by the controller circuitry 510, to control the operation of the PMOS switch devices 652, 654, 656, 662, 664, 666.

Using the voltage selected by the multiplexer circuitry 618 as both the bulk biasing voltage and the gate drive voltage for the PMOS switch devices 652, 654, 656, 662, 664, 666 helps to ensure correct switching operation of the PMOS switch devices 652, 654, 656, 662, 664, 666.

As will be appreciated from the foregoing description, the circuitry described above with reference to FIGS. 3-6 may be physically smaller and have fewer connection pins or balls and lower power consumption than the circuitry of FIGS. 1 and 2, and is able to provide a bias voltage to one or more bias voltage output nodes in both a first (relatively higher power) and a second (relatively lower power) operating mode.

Although the examples described above and illustrated in FIGS. 1-6 include three bias voltage output nodes 340, 342, 344, it will be appreciated that more or fewer bias voltage output nodes could be provided. For example, only a single bias voltage output node may be provided. Alternatively, any number greater than 1 (i.e. a plurality) of bias voltage output nodes may be provided.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for selecting a bias voltage to output at a bias voltage output node of the circuitry, the circuitry comprising:
   a first circuit node configured to receive a first voltage from a first, unregulated, voltage source;
   a second circuit node configured to receive a second voltage;
   regulator circuitry for generating the second voltage;
   a switch arrangement configured to selectively couple the bias voltage output node to the first circuit node or the second circuit node; and
   control circuitry, wherein the control circuitry is configured to control the operation of the switch arrangement and to selectively enable or disable the regulator circuitry based on a mode control signal received by the control circuitry.

2. Circuitry according to claim 1, wherein the regulator circuitry comprises:
   first regulator circuitry configured to be coupled to a battery of a host device containing the circuitry; and
   second regulator circuitry coupled to an output of the first regulator circuitry, wherein the second regulator circuitry is configured to receive a first regulated voltage output by the first regulator circuitry and to generate the second voltage.

3. Circuitry according to claim 1 wherein the mode control signal is based on an output of a transducer that is coupled to the bias voltage output node.

4. Circuitry according to claim 1 wherein the circuitry comprises a plurality of output bias voltage nodes and the switch arrangement comprises a switch network configured to selectively couple each of the plurality of output bias voltage nodes to one of the first or second nodes.

5. Circuitry according to claim 1 wherein the switch arrangement comprises a plurality of PMOS switch devices.

6. Circuitry according to claim 5 wherein the circuitry further comprises voltage selection circuitry configured to determine which one of the first voltage and the second voltage has the greater magnitude, and to apply the one of the first and second voltages that is determined to have the greater magnitude to bulk terminals of the PMOS switch devices.

7. Circuitry according to claim 6 wherein the voltage selection circuitry is further configured to provide the one of the first and second voltages that is determined to have the greater magnitude for use as a gate drive voltage for the PMOS switch devices.

8. Circuitry according to claim 6 wherein the voltage selection circuitry comprises:
   comparator circuitry configured to receive the first and second voltages and to output a control signal indicative of which of the first and second voltages has the greater magnitude; and
   multiplexer circuitry configured to receive the first and second voltages and the control signal output by the comparator circuitry and to output the one of the first and second voltages that has the greater magnitude based on the control signal.

9. Circuitry according to claim 1 wherein the control circuitry is configured to:
   enable the first regulated voltage source; and
   couple the bias voltage output node to the first node in response to a mode control signal received by the controller circuitry indicative of detection of a user activation command.

10. Circuitry according to claim 1 wherein the control circuitry is configured to:
    disable the first regulated voltage source; and
    couple the bias voltage output node to the second node in response to a mode control signal received by the controller circuitry indicative that no user command has been detected for a predetermined period of time.

11. Circuitry according to claim 1 wherein the mode control signal is based on an output of a transducer that is coupled to the bias voltage output node.

12. Integrated circuitry comprising the circuitry of claim 1.

13. A device comprising the circuitry of claim 1.

14. A device according to claim 13, wherein the device comprises a mobile telephone, a tablet or laptop computer, a smart speaker, an accessory device, headphones, earphones or earbuds.

15. Circuitry for providing a bias voltage to a plurality of bias voltage output nodes, the circuitry comprising:
    a first node configured to receive a first regulated voltage from a first regulated voltage source;
    a second node configured to receive a second unregulated voltage from a second unregulated voltage source; and
    a switch network operative to selectively couple each of the plurality of bias voltage output nodes to one of the first or second nodes.

16. Circuitry for selecting a bias voltage to output at a bias voltage output node of the circuitry, the circuitry comprising:
    a first circuit node configured to receive a first voltage from a first, unregulated, voltage source;
    a second circuit node configured to receive a second voltage from a second, regulated, voltage source; and
    a switch arrangement configured to selectively couple the bias voltage output node to the first circuit node or the second circuit node,
    wherein the switch arrangement comprises a plurality of PMOS switch devices, and wherein the circuitry further comprises voltage selection circuitry configured to determine which one of the first voltage and the second voltage has the greater magnitude, and to apply the one of the first and second voltages that is determined to have the greater magnitude to bulk terminals of the PMOS switch devices.

* * * * *